United States Patent [19]

Bowling et al.

[11] Patent Number: 4,947,546
[45] Date of Patent: Aug. 14, 1990

[54] METHOD OF MAKING A CABLE ASSEMBLY

[75] Inventors: Joseph M. Bowling, Carlisle; Matthew T. Miller, Harrisburg, both of Pa.

[73] Assignee: AMP Incorporated, Harrisburg, Pa.

[21] Appl. No.: 329,470

[22] Filed: Mar. 28, 1989

[51] Int. Cl.$^5$ .............................................. H01R 43/04
[52] U.S. Cl. ..................................... 29/861; 29/33 M; 29/711
[58] Field of Search ...................... 29/569.1, 711, 755, 29/712, 564.6, 33 M, 857

[56] References Cited

U.S. PATENT DOCUMENTS

| | | | |
|---|---|---|---|
| 3,995,358 | 12/1976 | Long et al. | 29/711 |
| 4,034,472 | 7/1977 | Cover et al. | |
| 4,238,874 | 12/1980 | Chandler et al. | |
| 4,254,547 | 3/1981 | Smith | 29/857 |
| 4,285,118 | 8/1981 | Peppler et al. | |
| 4,470,181 | 9/1984 | Sergeant | |
| 4,584,766 | 4/1986 | Ogawa et al. | |
| 4,734,651 | 3/1988 | Keller et al. | |

FOREIGN PATENT DOCUMENTS

| | | |
|---|---|---|
| 0007711 | 2/1980 | European Pat. Off. |
| 0063908 | 11/1982 | European Pat. Off. |
| 164570 | 1/1987 | European Pat. Off. |

OTHER PUBLICATIONS

International Wire & Cable Symposium Proceedings 1980, a Paper by R. G. Ebrey et al., pp. 178-186 (title is: Automatic Connectorization of 25 Pair Cable).

*Primary Examiner*—Carl J. Arbes
*Attorney, Agent, or Firm*—James M. Trygg

[57] ABSTRACT

The present invention is an automated method for making an electrical cable assembly including the automatic verification of insertion of each wire into its respective correct terminal and the automatic verification of the absence of short circuits. The overall system is controlled by a computer which is table driven by cable assembly parameters retained in a data base.

10 Claims, 4 Drawing Sheets

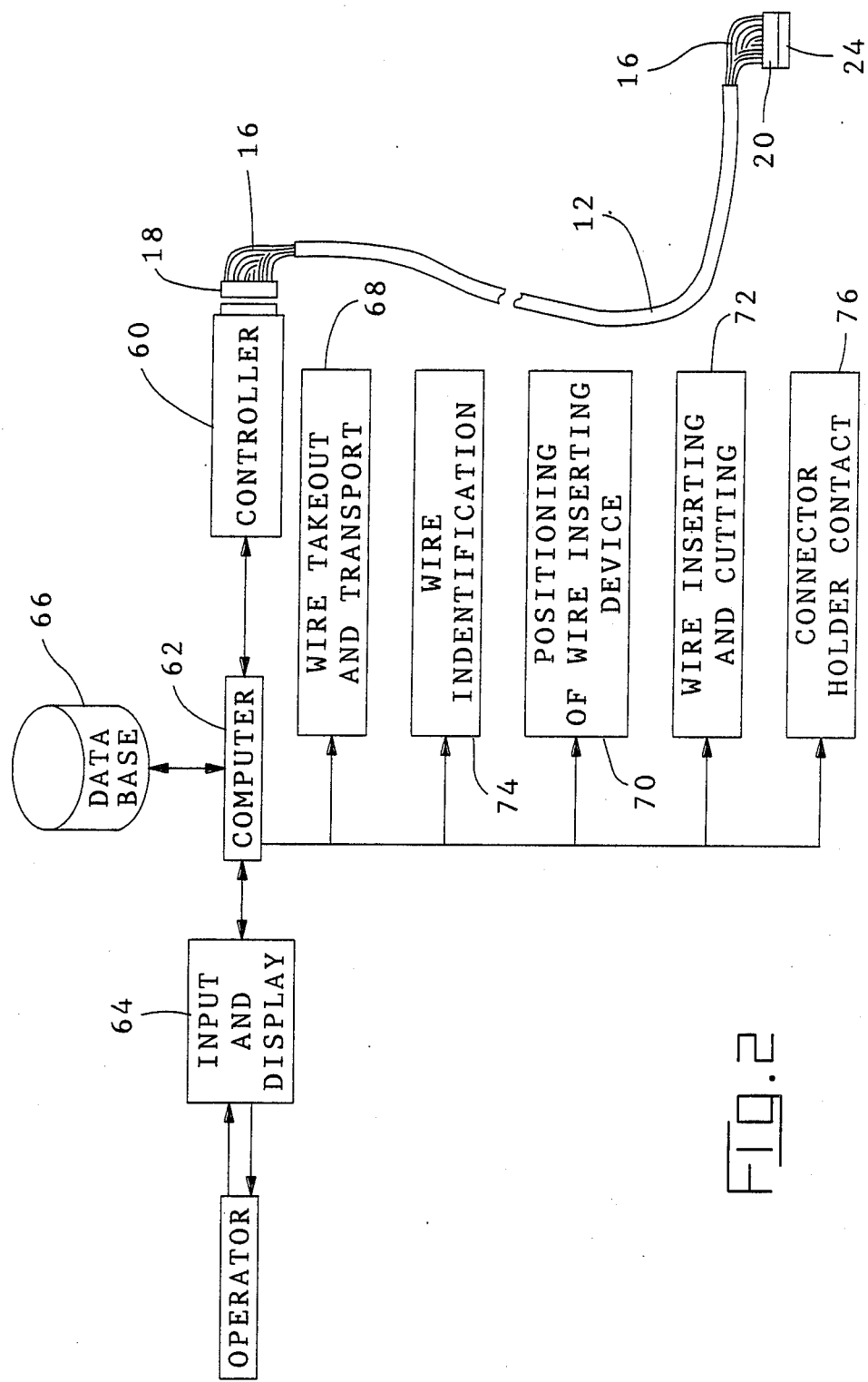

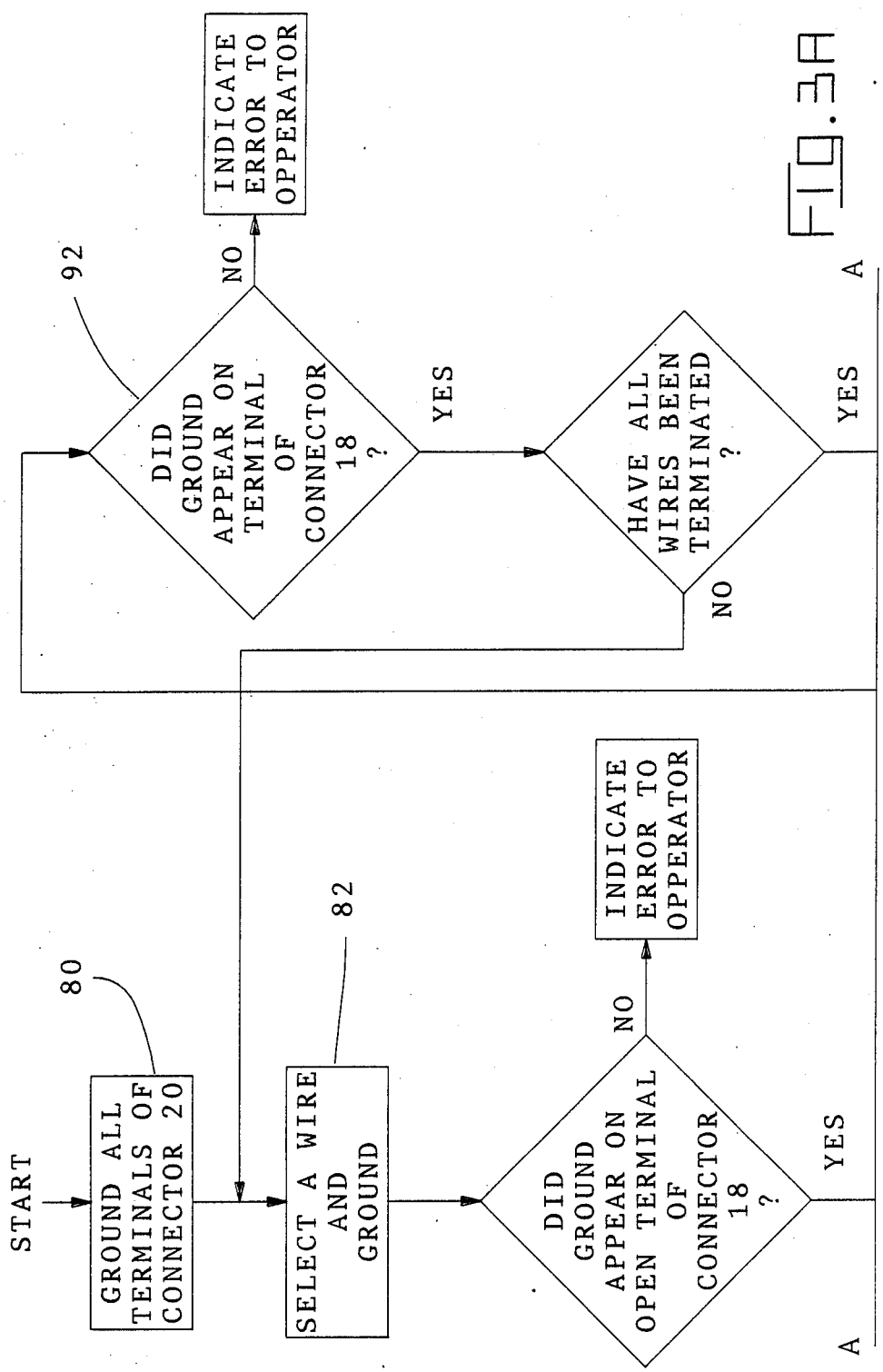

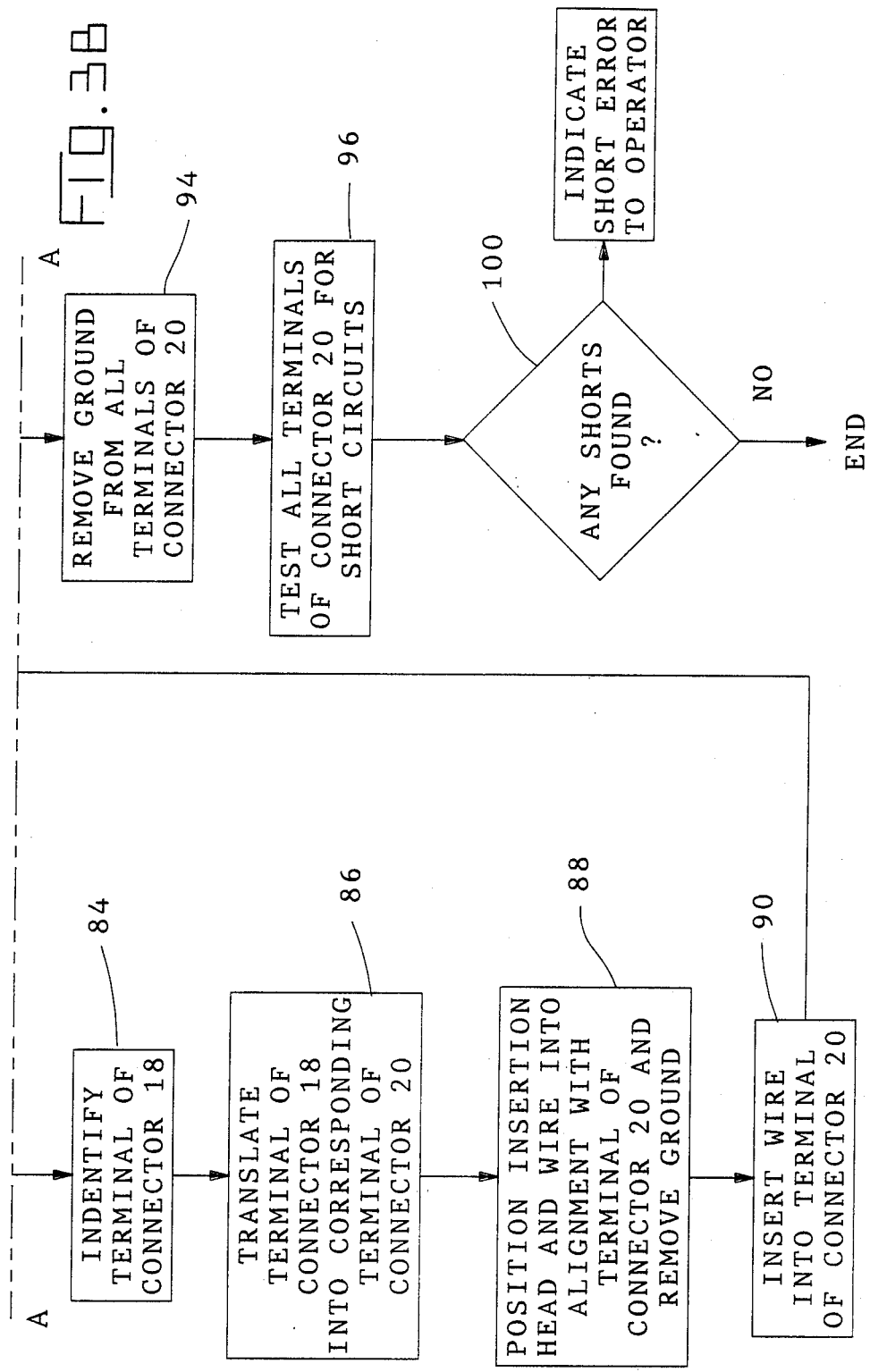

METHOD OF MAKING A CABLE ASSEMBLY

The present invention relates to an automated method of making an electrical cable assembly of the type having a plurality of discrete insulated wires within a common insulating jacket wherein each end of the wires terminates in a connector.

BACKGROUND OF THE INVENTION

A commonly known type of machine for making electrical cable assemblies is shown in U.S. Pat. No. 4,238,874 which issued Dec. 16, 1980 to Chandler et al. and which is hereby incorporated by reference as if set forth verbatim herein. The machine of Chandler et al. includes a connector holder, a pair of opposed wire inserting mechanisms, one on each side of the connector, a clamp for holding a jacketed cable directly above the connector, and means for positioning the terminals of the connector in alignment with the wire inserters. The operator will select the first pair of wires to be terminated, place the wires on opposite sides of the connector and in alignment with the first set of terminals which automatically trips a limit switch which activates the pair of wire inserters. The wires are inserted into the terminals and the connector is advanced to the next terminal position ready for the next pair of wires. This procedure continues until all of the cable pairs are terminated in the connector. Another similar machine is disclosed in U.S. Pat. No. 4,034,472 which issued July 12, 1977 to Cover et al. Both Chandler et al. and Cover et al require that an operator select each pair of wires and present them to the machine in the proper order for insertion. There is no capability to automatically select the wire pairs, nor is there any capability to perform continuity and other tests on the terminations being made.

An apparatus for automatically selecting a single wire from a stack of wires and positioning the wire in alignment with its respective terminal for insertion is disclosed in U.S. Pat. No. 4,470,181 which issued Sept. 11, 1984 to Sergeant, and which is hereby incorporated by reference as if set forth verbatim herein. Sergeant discloses a pair of rollers for holding a plurality of discrete wires in a planar vertical stack and an escapement mechanism for taking the bottom-most wire from the stack. The plurality of wires emanate from one end of a jacketed cable which is clamped in the machine. The wires at the other end of the cable are terminated in a connector. When a wire is taken from the stack, it is moved into a contact which pierces the insulation and makes electrical contact with the conductor of the wire. A signal, which appears on the contact is then impressed on the conductor and appears on the respective terminal of the connector at the other end of the cable, which is continuously monitored. The terminal upon which this signal appears is then translated into a corresponding terminal position at the insertion station which appropriately positions the connector for insertion of the selected wire. This apparatus, when combined with the machine of Chandler et al., resulted in a somewhat automated machine for making electrical cable assemblies.

What is needed is an automated machine for making electrical cable assemblies which automatically verifies that each wire, as it is being inserted, is properly inserted into the terminal by determining that continuity exists between the terminal and the conductor of the wire. Upon completion of the insertion of all wires, the terminals should be individually but automatically tested for shorts to other terminals. Further, complete flexibility should be present for translating, or mapping, the terminals of the terminated end into corresponding terminal positions at the inserting end.

BRIEF DESCRIPTION OF THE DRAWINGS

FIG. 2 is a block diagram showing the control functions of the cable assembly machine of the present invention.

FIG. 3 is a logic diagram showing various processing steps which illustrate the teachings of the present invention.

DESCRIPTION OF THE PREFERRED EMBODIMENT

Figure 1:
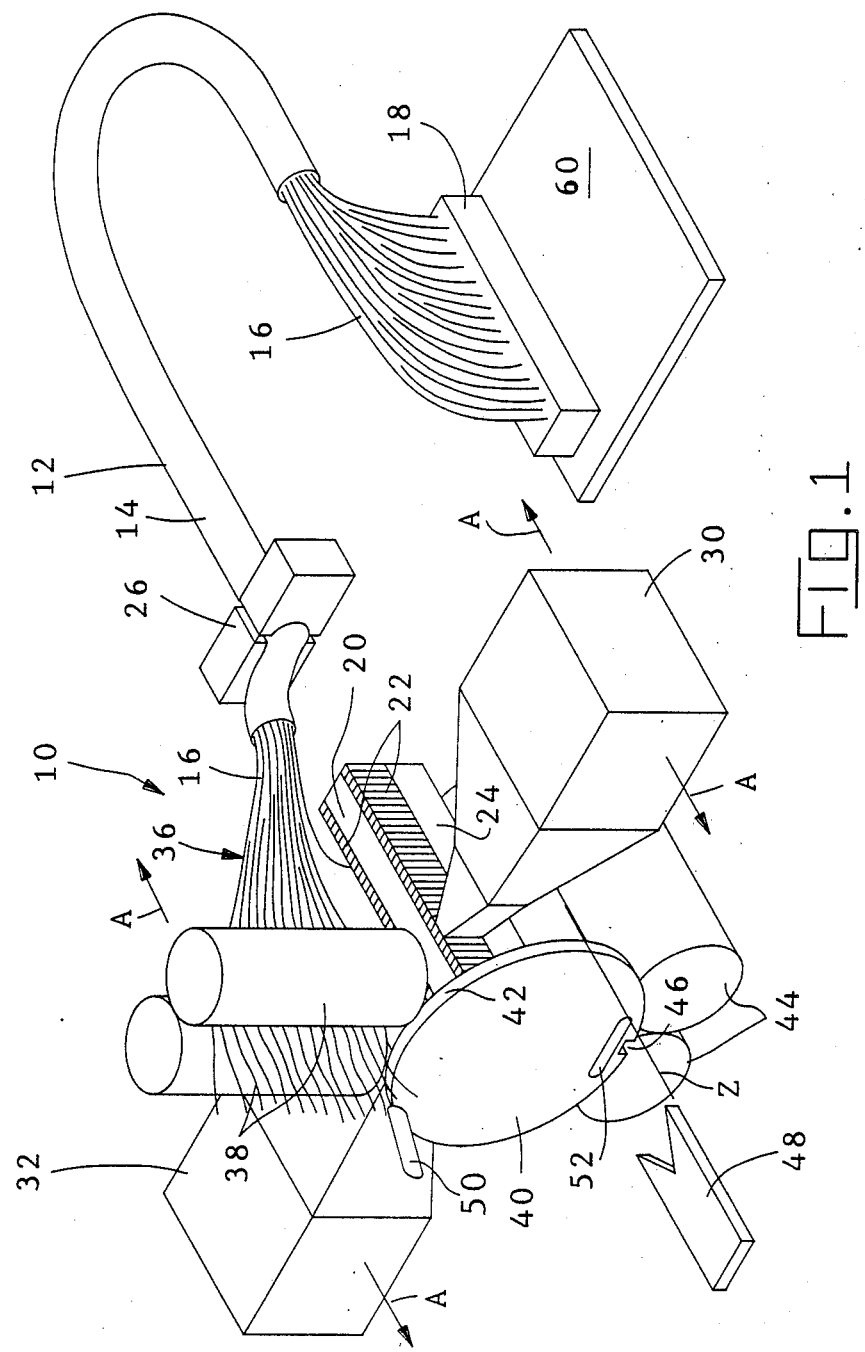
FIG. 1 is a schematic representation of a machine for making cable assemblies showing the major functional components.

There is shown in FIG. 1 a representation of a portion of a machine 10 for making a cable assembly 12. The cable assembly 12 comprises a jacketed cable 14, including a plurality of insulated wires 16, and a first connector 18 terminated at one end and a second connector 20 in the process of being terminated at the other end.

The machine 10 includes a holder 24 for holding the second connector 20 during the process of inserting the wires 16 into terminals 22 thereof. A cable clamp 26 is provided to hold an end of the jacketed cable 14 somewhat stationary with respect to the holder 24. A pair of wire trimming and inserting devices 30 and 32 are disposed in opposing relationship on each side of the holder 24, as shown in FIG. 3. The trimming and inserting devices 30, 32 are movable, either together as a unit or individually, in a direction parallel with the longitudinal axis Z of the connector holder 24, as indicated by the arrows A in FIG. 3.

As is shown in FIG. 1, the wires 16 at the clamped end are fanned out and arranged in a planar vertical stack 36 and disposed within a pair of rollers 38. The pair of rollers 38 are spaced apart a distance substantially equal to the diameter of one of the wires 16 thereby permitting only a single row of wires 16 in the stack 36. The rollers are arranged to rotate in opposite directions so that they tend to urge the individual wires 16 of the stack 36 in a direction away from the clamp 26. Further, a weight, not shown, may be placed against the top-most wire of the stack 36 to urge the stack downwardly. A rotatable wheel 40, arranged on an axis parallel to the axis Z has a peripheral edge 42 which abuts the lower-most wire 16 and thereby supports the weight of the stack 36. A second pair of rollers 44 are arranged directly under the holder 24 and have their rotational axes parallel with the axis Z. A notch 86 is disposed in the periphery 42 so that as the wheel 40 rotates, the notch 46 pauses directly under the stack 36 so that the end wire 16 will drop into the notch. As the wheel 40 continues to rotate, the wire 16 brought into engagement with a contact 50 which pierces the insulation and makes contact with the conductor of the wire 16. By a method that will be described below, the terminal 22 that is to receive the wire 16 is determined thereby determining to which side of the connector 20 the wire 16 should be directed. The wheel 40 is then rotated in the appropriate direction to place the wire on the desired side of the connector 20, rotation continuing until the notch 46 is positioned downwardly, as shown in FIG. 1.

A pusher 48 is then inserted through an opening 52 in the wheel 40, forcing the end of the wire 16 to engage the rollers 44 and be pulled downwardly and back toward the clamp 26 until the wire engages a wire stop, not shown, that is part of the respective inserting device 30, 32. The inserting device 30, 32 has already been positioned in alignment with the desired terminal 22 so that the wire 16 is positioned in alignment between the terminal 22 and the inserter. The inserter device 30, 32 is then activated and the wire 16 inserted into the terminal 22.

A controller 60 having a mating connector half accepts the connector 18, and making contact with all of the terminals thereof, communicates in the usual manner with a computer 62, as shown in FIG. 2.

The apparatus of the machine 10 so far described is more fully described in U.S. Pat. No. 4,470,181 which issued Sept. 11, 1984 to Sergeant and in U.S. Pat. No. 4,238,874 which issued Dec. 16, 1980 to Chandler et al., both of which are incorporated by reference as if set forth verbatim herein. However, it will be understood that other similar structures may be used advantageously. For example, the stack 36 may be oriented horizontal instead of vertical and the wire may be taken off either end of the stack by the notched wheel 40.

The computer 62 includes a standard input/output device 64, such as an electro luminiscent flat screen with infrared touch frame, which permits operator selection of computer displayed options. A suitable storage medium 66 is provided to contain the various programs and data elements necessary to control and operate the machine 10. As best seen in FIG. 2, the computer 62 is also in controlling communication with stepping or servo motors and transducers for the following functions: wire takeout and transport, indicated as 68, which includes the wheel 40, pusher 48, and rollers 44; positioning of the wire inserting device indicated as 70; which includes the inserting devices 30 and 32; and actuation of the wire inserting and cutting, indicated as 72 which operates the devices 30 and 32. The computer 62 is also in communication with sensors for: wire identification, indicated as 74 and including the contact 50; and connector holder contact, indicated as 76 and including contacts, not shown, which are contained within the holder 24 and electrically contact the terminals 22.

In operation, the operator will select, from the input and display device 64, the desired cable configuration which establishes in the computer memory the type of cable, number of wires and the color or number code and its corresponding connector terminal for each end of the cable assembly. This is accomplished by means of a group of interrelated tables maintained in the data base 66 as follows: (1) a Cable Type table includes a list of the wire identifiers, e.g. colors or numbers, for all of the wires in each different cable type; (2) a Reel Number table includes the type of cable on each different reel and the wire identifier corresponding to each terminal of the connector 18. Note that the axle end of the cable 14 of each reel will already have a connector 18 terminated thereto in accordance with the Reel Number table for that particular reel; (3) a First Connector table which contains the desired wire identification to terminal relationship for the connector to be installed on the first end of the cable 12; and (4) a Second Connector table having similar information pertaining to the connector to be installed on the second end of the cable 12.

The operation will now be described with reference to the logic diagram of FIG. 3. After selecting the desired cable configuration, the operator inserts a connector 20, of the desired type, into the holder 24 which automatically grounds, see 80 of FIG. 3, all terminals 22 of the connector 20. A reel is selected having the desired cable thereon. The wires 16 of the end of the cable 14 are fanned out and placed in a planar stack 36 between the rollers 38 and the cable clamped in the clamp 26 as shown in FIG. 1. The operator initiates automatic operation by selecting RUN on the input end display device 64. The wheel 40 then rotates so that the notch 46 takes the first wire 16 from the bottom of the stack 36 and grounds the conductor against the contact 50. See 82 of FIG. 3. Note that any suitable signal could be applied to the conductor of the wire 22 at this point instead of a ground signal. The terminals of the connector 18 are concurrently being monitored by the computer 62 for the appearance of the ground signal. If none appears, an error indication is displayed on the device 64. Otherwise, the terminal number of the terminal indicating the ground signal is translated into a corresponding terminal of the connector 20, see 86 of FIG. 3, by locating the terminal number in the Reel Number table, noting the corresponding wire identification, then locating the wire identification in the First Connector table and noting the corresponding terminal position which is the desired terminal position of the connector 20 which is to receive the selected wire. The wire trimming and inserting devices 30 and 32 are positioned into alignment with the desired terminal position of the connector 20. Concurrently, the notch 46 of the wheel 40 has been rotated to its full downward position, as seen in FIG. 1, and the pusher 48 activated to push the selected wire between the rollers 44. See 88 of FIG. 3. The rollers 44 pull the selected wire downwardly and back toward the cable clamp 24 until the wire abuts a wire stop in alignment with the inserted. The wire stop is part of the inserter devices 30 and 32 but is not shown. Note that when the notch 46 rotated the selected wire to its full down position, the wire conductor was necessarily brought out of contacting engagement with the contact 50 thereby removing the ground signal. The wire trimming and inserting device 30 or 32 is then actuated to insert the selected wire into the desired terminal. See 90 of FIG. 3.

As the wire is being inserted into the desired terminal of the connector 20, the corresponding terminal of the connector 18 is monitored for the appearance of a ground signal which would indicate a successful termination of the selected wire into the correct terminal of the connector 20. See 92 of FIG. 3. If no ground signal appears, an error is indicated on the input and display device 64. Otherwise, the above steps are repeated until all wires 16 have been taken from the stack 36.

After all wires 16 are terminated in the connector 20, the connector is removed from the connector holder 24 which removes the ground signal from the terminals. See 94 of FIG. 3. When the computer 62 senses this removal of the ground signal from all of the terminals, it initiates a continuity test between all the terminals of the connector 18 to identify any short circuits that may be present. See 96 of FIG. 3. If any short circuits are found, an error is indicated on the input and display device 64. Otherwise, the operator will sever the cable 12 to the desired length. See 100 of FIG. 3.

In the optional event that a second connector 20 is to be terminated to the wires 16 of the severed end of the cable 12, the first connector 20 is attached to a mating connector, not shown, on the controller 60 which will be interconnected with the computer 62 in the place of the connector 18. The operator then indicates that a second connector 20 is to be terminated by an appropriate selection from the input and display unit 64. This will cause the computer to utilize the Second Connector table instead of the First Connector table. The operator then inserts a desired second connector 20 into the connector holder 24, fans out the wires 16 of the end of the cable and places them in a planar stack 36, between the rollers 38, and then clamps the end of the cable in the clamp 26 as shown in FIG. 1. Again, the operator initiates automatic operation by selecting RUN on the input and display device 64. The steps 80 through 100, as shown in FIG. 3, are repeated resulting in a completed cable assembly 12 having a first connector 20 terminated at one end and a second connector 20 terminated at the other end.

A very important advantage of the present invention is the ability to verify that a particular wire was properly inserted into the terminal and that all terminations are free of short circuits.

Another important advantage of the present invention is that the terminal identifying and translating operations are table driven within the computer 62 which permits the addition of new or different cable types and different wire identifiers and corresponding terminals. Such flexibility permits the storage within the data base 66 of several Reel Number tables which correspond to a like number of physical reels of different cables that are available for use. The operator need only select the reel having the desired type cable, connect the connector 18 on the axle end of the cable to the controller 66, and indicate on the input and display device 64 the number of the selected reel. Similarly, the First and Second Connector tables can be varied and selected in any combination to suit a desired cable configuration.

We claim:

1. In a method of terminating a connector on the end of a cable having a first end and a second end, a first connector being terminated on said first end, wherein said method is performed by an automated machine, the steps comprising:
   (a) Loading a second connector into a connector holder;
   (b) Fanning out the wires of said cable and loading said wires into a planar stack;
   (c) Taking a wire from an end of said stack;
   (d) Determining the desired terminal of said second connector which is to receive said wire;
   (e) Positioning said desired connector terminal and said wire inserter into mutual alignment;
   (f) Positioning said wire in alignment between said connector terminal and said wire inserter;
   (g) Inserting said wire into said desired terminal by actuating said wire inserter;
   (h) Verifying that said wire was properly inserted by determining that continuity exists therebetween and indicating an improper termination, if present; then
   (i) Repeating steps (c) through (i) until all wires are taken from said stack;
   (j) Testing all terminals of said second connector for shorts, and indicating such shorts, if present;
   (k) Removing said cable and attached first and second connectors.

2. The method of claim 1 wherein step (h) includes: upon indicating an improper termination, proceeding directly to step (k).

3. The method of claim 1 wherein step (e) includes moving said wire inserter into alignment with said desired connector terminal.

4. The method of claim 1 including: applying a first signal to at least said desired terminal of said second connector; and wherein said verifying of step (h) includes: testing the terminal of said first connector attached to said wire for the presence of said first signal.

5. The method of claim 4 including applying said first signal to a plurality of terminals of said second connector.

6. The method of claim 5 wherein said first signal is a ground signal and said applying said first signal includes connecting said plurality of terminals to ground.

7. The method of claim 1 wherein said determining the desired terminal of step (d) includes: step (d1) applying a second signal to the conductor of said wire; step (d2) identifying the terminal of said first connector attached to said conductor upon said applying a second signal by testing for the presence of said second signal thereon and step (d3) translating said identified terminal to a corresponding terminal in said second connector.

8. The method of claim 7 wherein said second signal is a ground signal and said applying said second signal of step (e1) includes piercing the insulating covering of said wire, contacting the conductor thereof, and connecting said conductor to ground.

9. The method of claim 6 wherein prior to step (j), removing said ground signal from said plurality of terminals.

10. The method of claim 7 wherein said translating of step (d3) comprises locating said identified terminal in a selected Reel Number table and its corresponding wire identification, then locating said wire identification in a First Cable table and its corresponding terminal of said second connector.

* * * * *